(12) United States Patent
Cho et al.

(10) Patent No.: US 7,843,727 B2
(45) Date of Patent: Nov. 30, 2010

(54) MEMORY DEVICE AND DATA READING METHOD

(75) Inventors: Kyoung Lae Cho, Suwon-si (KR); Donghun Yu, Seoul (KR); Yoon Dong Park, Yongin-si (KR); Jun Jin Kong, Yongin-si (KR); Jae Hong Kim, Seoul (KR); Heeseok Eun, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 119 days.

(21) Appl. No.: 12/232,138

(22) Filed: Sep. 11, 2008

(65) Prior Publication Data

US 2009/0190397 A1    Jul. 30, 2009

(30) Foreign Application Priority Data

Jan. 30, 2008    (KR) ...................... 10-2008-0009753

(51) Int. Cl.
G11C 16/04    (2006.01)

(52) U.S. Cl. ........................... 365/185.03; 365/185.09; 365/185.11; 365/185.2

(58) Field of Classification Search ............ 365/185.03, 365/185.09, 185.11, 185.2
See application file for complete search history.

(56) References Cited

U.S. PATENT DOCUMENTS

| 2003/0041299 | A1 | 2/2003 | Kanazawa et al. |
| 2006/0026489 | A1 | 2/2006 | Noda et al. |
| 2007/0226592 | A1 | 9/2007 | Radke |
| 2007/0242522 | A1* | 10/2007 | Hemink ................. 365/185.24 |
| 2008/0137416 | A1* | 6/2008 | Lee ........................ 365/185.03 |

FOREIGN PATENT DOCUMENTS

EP    1 416 380    5/2004

* cited by examiner

*Primary Examiner*—Hoai V Ho
(74) *Attorney, Agent, or Firm*—Harness, Dickey & Pierce, P.L.C.

(57) ABSTRACT

A memory device and a memory data reading method are provided. The memory device may include: a multi-bit cell array; a programming unit that stores N data pages in a memory page in the multi-bit cell array; and a control unit that divides the N data pages into a first group and second group, reads data of the first group from the memory page, and determines a scheme of reading data of the second group from the memory page based on the read data of the first group.

13 Claims, 6 Drawing Sheets

FIG. 5

|  | 520 |  | 530 |
|---|---|---|---|
| 0 | 1 | 1 | 1 | ~ 515
| 0 | 1 | 0 | 0 | ~ 514
| 1 | 1 | 0 | 0 | ~ 513
| 1 | 0 | 0 | 1 | ~ 512
| 1 | 0 | 1 | 0 | ~ 511
| 0 | 0 | 1 | 1 | ~ 510
| 1 | 0 | 0 | 1 | ~ 509
| 1 | 0 | 0 | 0 | ~ 508
| 1 | 1 | 0 | 1 | ~ 507
| 1 | 1 | 1 | 0 | ~ 506
| 1 | 0 | 1 | 1 | ~ 505
| 0 | 0 | 1 | 0 | ~ 504
| 0 | 0 | 0 | 0 | ~ 503
| 0 | 1 | 0 | 1 | ~ 502
| 0 | 1 | 1 | 0 | ~ 501
| 1 | 1 | 1 | 1 | ~ 500

MEMORY DEVICE AND DATA READING METHOD

PRIORITY STATEMENT

This application claims priority from Korean Patent Application No. 10-2008-0009753, filed on Jan. 30, 2008, in the Korean Intellectual Property Office (KIPO), the entire contents of which is incorporated herein by reference.

BACKGROUND

1. Field

Example embodiments relate to a method of reading data in a memory device. Also, example embodiments relate to a method and apparatus for reading data in a multi-level cell (MLC) or multi-bit cell (MBC) memory device.

2. Description of Related Art

A single-level cell (SLC) memory device may store one bit of data in a single memory cell. The SLC memory may be referred to as a single-bit cell (SBC) memory. The SLC memory may store and read data of one bit at a voltage level included in two distributions that may be divided by a threshold voltage level programmed in a memory cell. Due to a fine electrical characteristic difference between SLC memories, the programmed threshold voltage level may have the distribution within a predetermined range. For example, when a voltage level read from the memory cell is greater than 0.5V and less than 1.5V, it may be determined that the data stored in the memory cell has a logic value of "1". When the voltage level read from the memory cell is greater than 2.5V and less than 3.5V, it may be determined that the data stored in the memory cell has a logic value of "0". The data stored in the memory cell may be classified depending on the difference between cell currents and/or cell voltages during the reading operations.

Meanwhile, a multi-level cell (MLC) memory device that can store data of two or more bits in a single memory cell has been proposed in response to a need for higher integration of memory. The MLC memory device may also be referred to as a multi-bit cell (MBC) memory. However, as the number of bits stored in the single memory cell increases, reliability may deteriorate and the read-failure rate may increase. To store 'm' bits in a single memory cell, a single threshold voltage level may be formed in the single memory cell from among $2^m$ threshold voltage levels. Due to a fine electrical characteristic difference between memory cells of MLC memories, when storing 'm' bits in each of the memory cells of the MLC memories, threshold voltage levels formed in the memory cells of the MLC memories may form $2^m$ distributions.

The number of distributions of threshold voltage levels in a voltage window may increase in proportion to $2^m$ as 'm' increases. A voltage window of a memory may be limited. Accordingly, when the distance between adjacent distributions decreases or distributions are overlapped due to the increase in 'm', the read-failure rate of data stored in a memory may increase. For this reason, it may be difficult to improve storage density using a MLC memory device.

With the current increase in the utilization of the MLC memory device, error correction codes or error control codes (ECC) that may detect an error during data storing and reading operations and correct the detected error are may be more widely used. As an error correcting capability of ECC increases, hardware complexity of an ECC decoder may increase.

SUMMARY

Example embodiments may provide a memory device and memory data reading method which may apply a new scheme of multi-level (multi-bit) reading to a multi-level cell (MLC) memory, and thereby may reduce complexity when embodying error control codes (ECC) as a hardware with respect to the MLC memory.

Example embodiments also may provide a memory device and memory data reading method which may reduce a maximum value of a Bit Error Rate (BER) per data page.

Example embodiments also may provide a memory device and memory data reading method which may equalize a BER per data page with respect to each of the data pages.

Example embodiments also may provide a memory device and memory data reading method which may control a distribution of errors with respect to each data page, and thereby may enable data to have an error rate within an error correcting capability. Accordingly, an error correctability with respect to each data page may increase.

A memory device according to example embodiments may include: a multi-bit cell array; a programming unit that stores N data pages in a memory page in the multi-bit cell array; and a control unit that divides the N data pages into a first group and second group, reads data of the first group from the memory page, and determines a scheme of reading data of the second group from the memory page based on the read data of the first group.

A memory device according to example embodiments, may include: a multi-bit cell array; a programming unit that multi-bit programs a plurality of data pages in a memory page in the multi-bit cell array; and a control unit that divides the plurality of data pages into a first group and a second group, reads data of the first group from the memory page using a first read scheme, and reads data of the second group from the memory page using a second read scheme. The first read scheme may be different from the second read scheme.

A memory data reading method which may read a plurality of data pages from a memory page including multi-bit cells according to example embodiments may include: dividing the plurality of data pages into a first group and a second group; reading data of the first group from the memory page; determining read voltage levels based on the read data of the first group, the read voltage levels being used to read data of the second group from the memory page; detecting a threshold voltage of the multi-bit cells of the memory page; and comparing the detected threshold voltage and the read voltage levels and determining the data of the second group.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIG. 5 illustrates a table of four-bit data according to example embodiments.

DETAILED DESCRIPTION OF EMBODIMENTS

Figure 1:
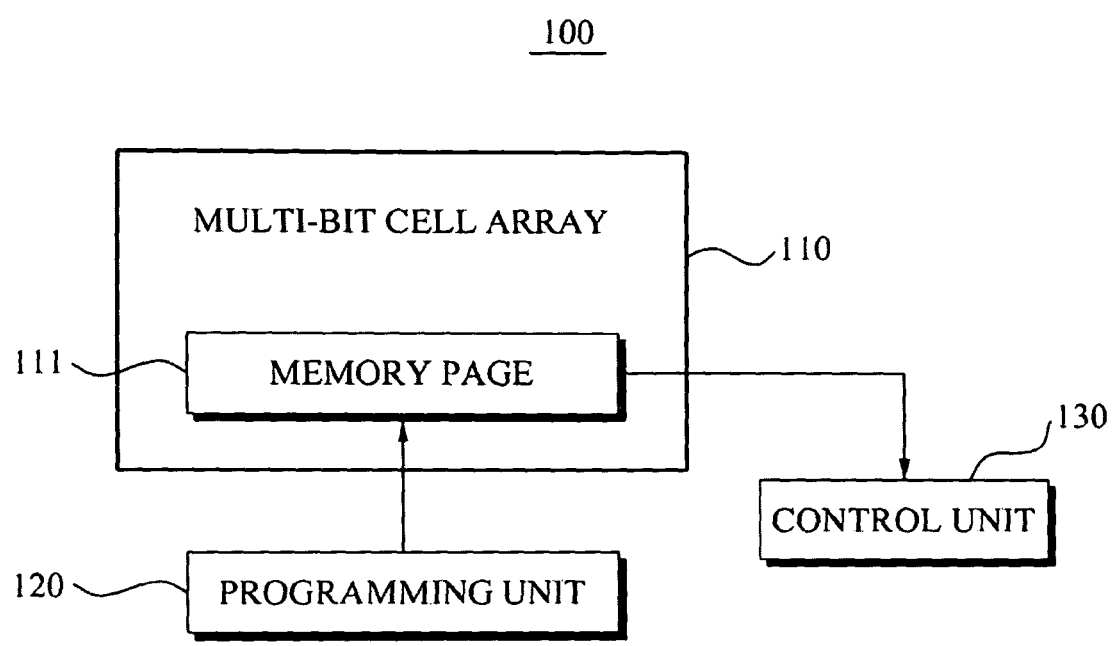
FIG. 1 is a block diagram illustrating a memory device according to example embodiments.

Detailed example embodiments are disclosed herein. However, specific structural and functional details disclosed herein are merely representative for purposes of describing example embodiments. Example embodiments may, however, may be embodied in many alternate forms and should not be construed as being limited to only the embodiments set forth herein.

Accordingly, while example embodiments are capable of various modifications and alternate forms, embodiments thereof are shown by way of example in the drawings and will herein be described in detail. It should be understood, however, that there is not intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, for example "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belongs. It will be further understood that terms, for example those defined in commonly used dictionaries, should be interpreted as having a meaning that is consistent with their meaning in the context of the relevant art and should not be interpreted in an idealized or overly formal sense unless expressly so defined herein. Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Reference will now be made to example embodiments, which are illustrated in the accompanying drawings, wherein like reference numerals may refer to like components throughout.

FIG. 1 is a block diagram illustrating a memory device 100 according to example embodiments.

Referring to FIG. 1, the memory device 100 may include a multi-bit cell array 110, a programming unit 120, and a control unit 130.

The multi-bit cell array 110 may include a plurality of multi-bit cells. A single multi-bit cell may store multi-bit data. A process of storing, by the memory device 100, data in the single multi-bit cell may be referred to as "programming" and may be performed based on mechanism, for example a Fowler-Nordheim (F-N) tunneling, Hot Carrier Effect (HCE), and the like.

The programming process may change the threshold voltage of the multi-bit cell. When the single multi-bit cell may store maximum m bits of data, $2^m$ threshold voltage levels may be formed in the single multi-bit cell.

Since the programming process may require a relatively longer period of time in comparison to a data reading process, the memory device 100 may simultaneously program a plurality of adjacent multi-bit cells to thereby reduce a programming time with respect to the whole multi-bit cell array. A set of the simultaneously programmed physical multi-bit cells may be referred to as a "memory page" 111. The memory page 111 may be a set of multi-bit cells connected to a single word line.

When the memory page 111 may include p multi-bit cells and a single multi-bit cell may store m bits of data, the memory page 111 may store (p×m, e.g., p multiplied by m) bits of data.

Each of the multi-bit cells in the page may arrange the m-bit data from a most significant bit (MSB) to a least significant bit (LSB) to thereby store the arranged data. The programming unit 120 of the memory device 100 may sequentially store lower bits than the MSB after storing the MSB in the single multi-bit cell. The LSB may be lastly stored in the multi-bit cell.

According to example embodiments, the programming unit 120 may sequentially store bits higher than the LSB after storing the LSB in the single multi-bit cell. The MSB may be lastly stored in the multi-bit cell.

The programming unit 120 may sequentially store bits lower than the MSB after storing the MSB of each of the multi-bit cells in each of the multi-bit cells of the memory page 111. A set of MSBs stored in each of the multi-bit cells of the memory page 111 may be referred to as a data page. When the memory page 111 includes the p multi-bit cells, the data page may be a bit stream of p-bits.

The programming unit 120 may finally store LSBs of each of the multi-bit cells in each of the multi-bit cells of the memory page 111. A set of LSBs stored in each of the multi-bit cells of the memory page 111 may be another data page.

If each of the multi-bit cells of the memory page 111 may store the m-bits data, m data pages may be stored in the memory page 111.

In order to store the m data pages in the memory page 111, the programming unit 120 may require m page programming operations. During each page programming operation, the programming unit 120 may store a single data page in the memory page 111.

If the programming unit 120 stores a first data page in the memory page 111 through a first page programming operation, each threshold voltage of the multi-bit cells of the memory page 111 may form two threshold voltage states.

For example, when the programming unit 120 changes a threshold voltage of multi-bit cell storing data of "1" into 1 V, and changes a threshold voltage of multi-bit cell storing data of "0" into 2.5 V, the threshold voltage of multi-bit cell storing data of "1" may correspond to a distribution of 0.7 V through 1.3 V, and the threshold voltage of multi-bit cell storing data of "0" may correspond to a distribution of 2.2 V through 2.8 V since an electric characteristic of multi-bit cells is slightly different.

In the present specification, a distribution of a predetermined range of threshold voltages of the multi-bit cells storing data may be referred to as a 'distribution state' or 'threshold voltage state'. The terms 'distribution state' or 'threshold voltage state' are used to simplify descriptions and are not meant to limit the scope of example embodiments.

If the programming unit 120 performs a second page programming operation after performing the first page programming operation, and stores the first data page and second data page in the memory page 111, threshold voltages of the multi-bit cells of the memory page 111 may form four threshold voltage states.

When the multi-bit cells of the memory page 111 store the m-bit data, the threshold voltage of the multi-bit cells of the memory page 111 may form $2^m$ threshold voltage states. Since a possibility of incorrectly reading data may increase as an interval between the threshold voltage states decreases, a data page stored during a last page programming operation, for example, a data page corresponding to the LSB, may include more errors than previously stored data pages.

The control unit 130 may divide the m data pages into a first group and second group. For example, the first group may be from a first data page to an $(m-1)^{th}$ data page, and the second group may be an $m^{th}$ data page.

The control unit 130 may determine a scheme of reading data of the second group from the memory page 111 based on data of the first group, after reading the data of the first group from the memory page 111.

The control unit 130 may determine a number of times that the control unit 130 is required to read the data of the second group and a number of read voltage levels used when reading the data of the second group based on the read data of the first group. The control unit 130 may determine a read voltage level used to read the data of the second group based on the read data of the first group.

Figure 2:
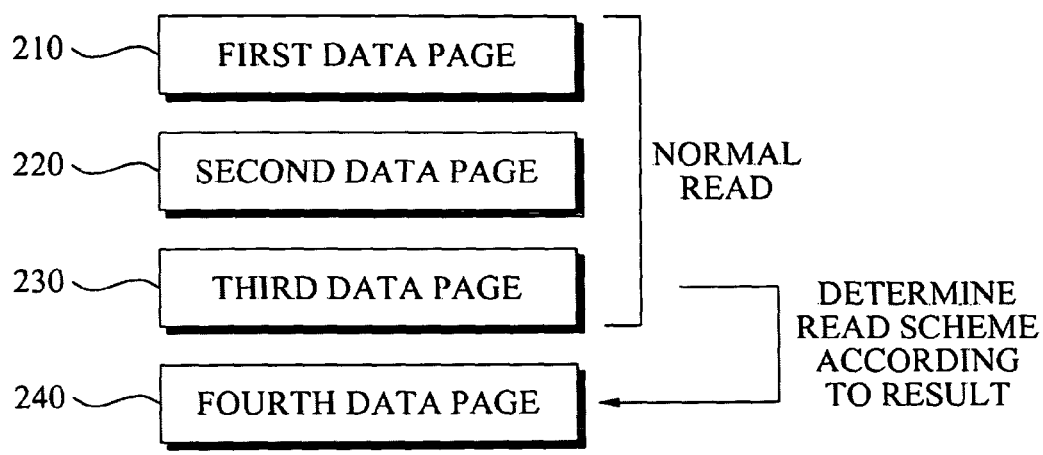
FIG. 2 is a diagram illustrating four data pages according to example embodiments.

FIG. 2 is a diagram illustrating four data pages according to example embodiments.

Referring to FIG. 2, the four data pages 210, 220, 230, and 240 may be stored in multi-bit cells in a memory page 111. A control unit 130 may generate the first data page 210, second data page 220, and third data page 230 as a first group, and may generate the fourth data page 240 as a second group.

The control unit 130 may read the first data page 210, second data page 220, and third data page 230, which may be included in the first group, using a normal read scheme.

After reading data of the first group using the normal read scheme, the control unit 130 may determine a scheme of reading the fourth data page 240, which may be included in the second group, based on the read data of the first group.

As described above, the control unit 130 may determine a number of times that the control unit 130 is required to read the fourth data page 240 and a number of read voltage levels applied when reading the fourth data page 240. The control unit 130 may determine a read voltage level used to read the fourth data page 240.

Figure 3:
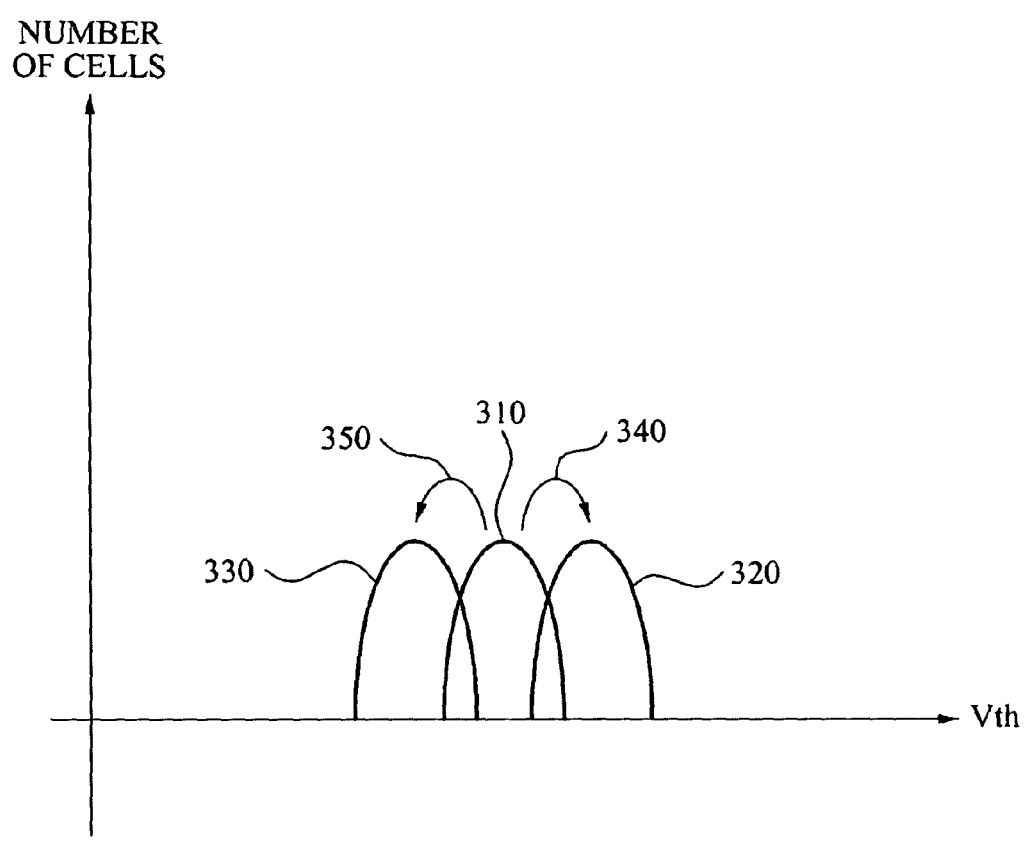
FIG. 3 illustrates a mechanism showing a change of distribution of threshold voltages of multi-bit cells based on time according to example embodiments.

FIG. 3 illustrates a mechanism showing a change in distribution of threshold voltages of multi-bit cells based on time according to example embodiments.

Referring to FIG. 3, a horizontal axis indicates a threshold voltage of multi-bit cells and a vertical axis indicates a number of multi-bit cells with a corresponding threshold voltage.

The threshold voltages of multi-bit cells storing specific data forms a threshold voltage state 310. Over time, the threshold voltages which have formed the threshold voltage state 310 may change to form a threshold voltage state 320 or threshold voltage state 330.

A Floating Gate (FG) coupling mechanism may cause a process 340 of changing a threshold voltage of the multi-bit cells from the threshold voltage state 310 into the threshold voltage state 320. The threshold voltage state 320 may be higher than the threshold voltage state 310.

FG coupling may refer to a phenomenon where threshold voltages of centrally located multi-bit cells may be affected by a change of threshold voltages of surrounding multi-bit cells. The threshold voltages of centrally located multi-bit cells may be affected by coupling of a parasitic capacitance among FGs of the multi-bit cells.

When a programming operation increases the threshold voltages of multi-bit cells, the threshold voltages of centrally located multi-bit cells may increase more than a desired value due to the FG coupling.

A charge loss mechanism may cause a process 350 of changing the threshold voltages of the multi-bit cells from the threshold voltage state 310 into the threshold voltage state 330. The threshold voltage state 330 may be lower than the threshold voltage state 310.

An insulation layer may be inserted between a Control Gate (CG) and FG in the multi-bit cells. Also, another insulation layer may be inserted between the FG and a substrate. When a particular voltage is applied on the CG and substrate, a programming unit 120 may electrically charge the FG or discharge the FG. The process of charging or discharging may be performed by the F-N tunneling, Hot Carrier effect, and the like. The charge, electrically charged in the FG, may be required to be maintained before a discharge condition is satisfied. However, since the charge electrically charged in the FG may spread due to a natural spread or insulation around the FG is damaged, the charge in the FG may decrease. Accordingly, a leaking path of the charge may be formed and the charge electrically charged in the FG may be lost.

In general, the charge loss mechanism losing the charge in the FG may tend to decrease a threshold voltage of multi-bit cells. The charge loss mechanism may cause the process 350.

A distribution of the threshold voltage of multi-bit cells may tend to be spread due to the FG coupling mechanism and charge loss mechanism.

Since a voltage window where the multi-bit cells are operated may be limited, a possibility where the distribution of the threshold voltage is overlapped may increase, as the distribution of the threshold voltage spreads. As an overlapped area of threshold voltage states of the multi-bit cells storing different data may increase, an error when reading data may increase.

The control unit 130 may estimate a change of the threshold voltages of the multi-bit cells in a multi-bit cell array 110. The change may be caused by the FG coupling mechanism. The control unit 130 may determine a read voltage level used to read data of a second group using the estimated change. The control unit 130 may predict a case when the threshold voltages of the multi-bit cells changes due to the FG coupling mechanism, and thereby may control the read voltage level used to read the data of the second group.

The control unit 130 may estimate a change of the threshold voltages of the multi-bit cells in the multi-bit cell array 110. The change may be caused by the charge loss mechanism. The control unit 130 may determine a read voltage level used to read the data of the second group using the estimated change. The control unit 130 may predict a case when the threshold voltages of the multi-bit cells changes due to the charge loss mechanism, and thereby may control the read voltage level used to read the data of the second group.

Figure 4:
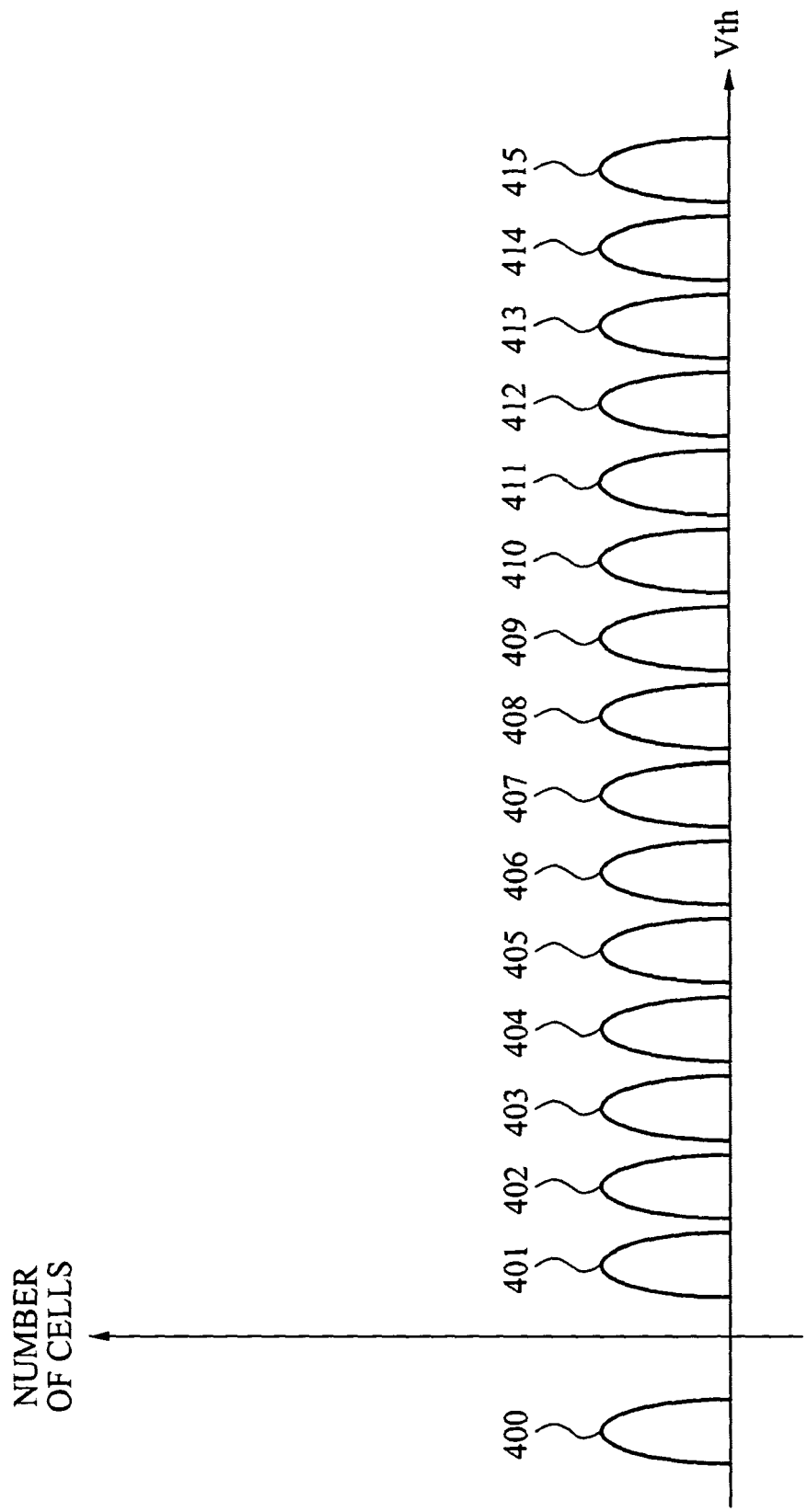
FIG. 4 illustrates a distribution of threshold voltages of multi-bit cells in a multi-bit cell array according to example embodiments.

FIGS. 4 and 5 are used to describe an example of storing four-bit data according to example embodiments.

FIG. 4 illustrates a distribution of threshold voltages of multi-bit cells in a multi-bit cell array according to example embodiments.

Referring to FIG. 4, a horizontal axis indicates a threshold voltage of multi-bit cells and a vertical axis indicates a number of multi-bit cells with a corresponding threshold voltage.

FIG. 5 illustrates a table of four-bit data according to example embodiments.

Referring to FIG. 5, columns indicate the four-bit data that may be stored in a single multi-bit cell.

A column 500 indicates data of "1111", and multi-bit cells storing the data of "1111" have a zeroth threshold voltage state 400.

A column 501 indicates data of "0110", and multi-bit cells storing the data of "0110" have a first threshold voltage state 401.

A column 502 indicates data of "0101", and multi-bit cells storing the data of "0101" have a second threshold voltage state 402.

A column 503 indicates data of "0000", and multi-bit cells storing the data of "0000" have a third threshold voltage state 403.

A column 504 indicates data of "0010", and multi-bit cells storing the data of "0010" have a fourth threshold voltage state 404.

A column 505 indicates data of "1011", and multi-bit cells storing the data of "1011" have a fifth threshold voltage state 405.

A column 506 indicates data of "1110", and multi-bit cells storing the data of "1110" have a sixth threshold voltage state 406.

A column 507 indicates data of "1101", and multi-bit cells storing the data of "1101" have a seventh threshold voltage state 407.

A column 508 indicates data of "1000", and multi-bit cells storing the data of "1000" have an eighth threshold voltage state 408.

A column 509 indicates data of "0001", and multi-bit cells storing the data of "0001" have a ninth threshold voltage state 409.

A column 510 indicates data of "0011", and multi-bit cells storing the data of "0011" have a tenth threshold voltage state 410.

A column 511 indicates data of "1010", and multi-bit cells storing the data of "1010" have an eleventh threshold voltage state 411.

A column 512 indicates data of "1001", and multi-bit cells storing the data of "1001" have a twelfth threshold voltage state 412.

A column 513 indicates data of "1100", and multi-bit cells storing the data of "1100" have a thirteenth threshold voltage state 413.

A column 514 indicates data of "0100", and multi-bit cells storing the data of "0100" have a fourteenth threshold voltage state 414.

A column 515 indicates data of "0111", and multi-bit cells storing the data of "0111" have a fifteenth threshold voltage state 415.

A programming unit 120 may form $2^4=16$ threshold voltage states, and may store the four-bit data in each of the multi-bit cells of the memory page 111.

The programming unit 120 may form 16 threshold voltage states using 15 verify voltage levels. Also, the programming unit 120 may store four data pages in the memory page 111 by forming the 16 threshold voltage states.

A single page programming operation may include a plurality of unit programming operations. The programming unit 120 may compare the verify voltage levels and threshold voltage of the multi-bit cells every time the unit programming operation is finished, and thereby may determine whether data is programmed. For example, the programming unit 120 may determine whether a threshold voltage of each of the multi-bit cells is higher than a verify voltage level corresponding to the fifteenth threshold voltage state 415. According to example embodiments, the data of "0111" may be stored in the threshold voltage of each of the multi-bit cells every time the unit programming operation is finished. The programming unit 120 may stop performing the unit programming operation with respect to multi-bit cells with a threshold voltage higher than the verify voltage level. The programming unit 120 may perform the unit programming operation with respect to multi-bit cells with a threshold voltage lower than the verify voltage level.

In FIG. 5, the top three bits of each row may be set by a control unit 130 as a first group 520. An LSB of each row may be set by the control unit 130 as a second group 530.

After reading data of the first group 520, the control unit 130 may set each of a plurality of result values of the read data of the first group 520 as one symbol among a plurality of symbols. Since the first group 520 includes three-bit data, eight symbols different from each other may exist.

The control unit 130 may divide the eight symbols into a plurality of symbol groups according to a distribution pattern of threshold voltage. The control unit 130 may divide the plurality of symbol groups based on an FG coupling and charge loss mechanism. According to example embodiments, minimization or lowering of reading frequency and/or minimization or lowering of an error rate when reading may be used as one criterion of dividing the plurality of symbol groups. For example, the control unit 130 may set symbols, "111", "011", and "010", as a first symbol group, and symbols, "000", "001", and "101", as a second symbol group. Also, the control unit 130 may set symbols, "110" and "100", as a third symbol group.

The control unit 130 may assign a first read voltage level to the first symbol group, a second read voltage level to the second symbol group, and a third read voltage level to the third symbol group. The control unit 130 may use the first read voltage level during a read operation reading an LSB of multi-bit cells storing data of the first symbol group. The control unit 130 may use the second read voltage level during a read operation reading an LSB of multi-bit cells storing data of the second symbol group. The control unit 130 may use the third read voltage level during a read operation reading an LSB of multi-bit cells storing data of the third symbol group.

The control unit 130 may determine any one of voltage levels between the third threshold voltage state 403 and fourth threshold voltage state 404 as the first read voltage level.

When multi-bit cells storing data of "111", "011", and "010" have a threshold voltage lower than the first read voltage level according to a result of reading data of top three bits, it may be read that the multi-bit cells have data of "1111", "0110", and "0101". When the multi-bit cells have a threshold voltage higher than the first read voltage level, it may be read that the multi-bit cells have data of "1110", "0111", and "0100".

The first read voltage level may be used to divide the multi-bit cells storing the data of the first symbol group into multi-bit cells higher than the first read voltage level and multi-bit cells lower than the first read voltage level.

The multi-bit cells storing the data of the first symbol group have the zeroth threshold voltage state 400, first threshold voltage state 401, second threshold voltage state 402, sixth threshold voltage state 406, fourteenth threshold voltage state 414, and fifteenth threshold voltage state 415. Since the first read voltage level may be located between the third threshold voltage state 403 and fourth threshold voltage state 404, the multi-bit cells with a threshold voltage lower than the first read voltage level may have a read margin in a range of the third threshold voltage state 403. The multi-bit cells with the threshold voltage higher than the first read voltage level may have a read margin in a range of the fourth threshold voltage state 404 and fifth threshold voltage state 405. According to example embodiments, a significantly large read margin may exist during a read operation reading the second group 530, that is, LSB. The read margin may be significantly large, even when considering data corruption caused by the FG coupling mechanism or charge loss mechanism.

As described above, in example embodiments, the significantly large read margin may be obtained while reading the second group 530. Accordingly, a parity check or error control codes (ECC) decoding with respect to the data of the second group 530 may not be performed. A relatively simple Error Check Code, for example a Cyclic Redundancy Check (CRC) may be used. The control unit 130 ECC may decode the read data of the first group 520, and may determine a scheme of reading the data of the second group 530 from a memory page 111 based on the ECC decoded data of the first group 520. The control unit 130 may not ECC decode the data of the second group 530. According to example embodiments, in a memory device 100, a significantly large read margin may be guaranteed with respect to the data of the second group 530.

The control unit 130 may determine any one of voltage levels between the sixth threshold voltage state 406 and seventh threshold voltage state 407 as the second read voltage level.

When multi-bit cells storing data of "000", "001", and "101" have a threshold voltage lower than the second read voltage level according to the result of reading the data of top three bits, it may be read that the multi-bit cells have data of "0000", "0010", and "1011". When the multi-bit cells have a threshold voltage higher than the second read voltage level, it may be read that the multi-bit cells have data of "0001", "0011", and "1010".

According to example embodiments, the second read voltage level may be used to divide the multi-bit cells storing the data of the second symbol group into multi-bit cells higher than the second read voltage level and multi-bit cells lower than the second read voltage level.

The multi-bit cells storing the data of the second symbol group may have the third threshold voltage state 403, fourth threshold voltage state 404, fifth threshold voltage state 405, ninth threshold voltage state 409, tenth threshold voltage state 410, and eleventh threshold voltage state 411. Since the second read voltage level is located between the sixth threshold voltage state 406 and seventh threshold voltage state 407, the multi-bit cells with a threshold voltage lower than the second read voltage level may have a read margin in a range of the sixth threshold voltage state 406. The multi-bit cells with the threshold voltage higher than the second read voltage level may have a read margin in a range of the seventh threshold voltage state 407 and eighth threshold voltage state 408. The control unit 130 may have a significantly large read margin during a read operation reading the second group 530. The read margin may be significantly large, even when considering data corruption caused by the FG coupling mechanism or charge loss mechanism.

The control unit 130 may determine any one of voltage levels between the ninth threshold voltage state 409 and tenth threshold voltage state 410 as the third read voltage level.

If multi-bit cells storing data of "110" and "100" have a threshold voltage lower than the third read voltage level according to the result of reading the data of top three bits, it may be read that the multi-bit cells have data of "1101" and "1000". When the multi-bit cells have a threshold voltage higher than the third read voltage level, it may be read that the multi-bit cells have data of "1100" and "1001".

The third read voltage level may be used to divide the multi-bit cells storing the data of the third symbol group into multi-bit cells higher than the third read voltage level and multi-bit cells lower than the third read voltage level.

The multi-bit cells storing the data of the third symbol group may have the seventh threshold voltage state 407, eighth threshold voltage state 408, twelfth threshold voltage state 412, and thirteenth threshold voltage state 413. Since the third read voltage level may be located between the ninth threshold voltage state 409 and tenth threshold voltage state 410, the multi-bit cells with a threshold voltage lower than the third read voltage level may have a read margin in a range of the ninth threshold voltage state 409. The multi-bit cells with the threshold voltage higher than the third read voltage level may have a read margin in a range of the tenth threshold voltage state 410 and eleventh threshold voltage state 411. The control unit 130 may have a significantly large read margin during a read operation reading the second group 530. The read margin may be significantly large, even when considering data corruption caused by the FG coupling mechanism or charge loss mechanism.

The programming unit 120 may adjust a distance between threshold voltage states by adjusting a distance between verify voltage levels. For example, if the zeroth threshold voltage state 400 and first threshold voltage state 401 become close, a multi-bit cell storing the data of "1111" may be incorrectly read as a multi-bit cell storing the data of "0110", or the multi-bit cell storing the data of "0110" may be incorrectly read as the multi-bit cell storing the data of "1111". The programming unit 120 may adjust the distance between threshold voltage states, and thereby may control a BER of each data page of the first group 520.

According to example embodiments, an ECC decoding operation may be performed with respect to each data page. The ECC decoding operation may be used to reduce an error of data read from the multi-bit cells. If, for example, a first data page has a BER of $10^{(-4)}$ and a second data page has a BER of $10^{(-2)}$, an ECC decoder performing the ECC decoding operation may be required to control an error of a data page with the BER of $10^{(-2)}$. As the ECC decoder may control data pages with higher BERs, hardware complexity of the ECC decoder may increase. High hardware complexity may cause an increase in a size of a memory device 100.

Accordingly, the programming unit 120 may control the verify voltage levels so that each of the data pages of the first group 520 may have a similar BER.

In example embodiments, in the memory device 100, the ECC decoding operation may be performed with respect to the data of the first group 520, and may not be performed with respect to the data of the second group 530. Accordingly, a simple ECC decoder may control the error, and thus hardware complexity of the memory device 100 may decrease.

According to example embodiments, in the memory device 100, when the first group 520 includes (N−1) data pages, and if a number of read voltage levels is less than $2^{(N-1)}$, a BER of a data page may be lower than a BER in a conventional art. According to example embodiments, the read voltage levels may be used to read each of the data pages of the first group 520. The programming unit 120 may enable a number of read voltage levels to be less than $2^{(N-1)}$ by controlling the verify voltage levels. According to example embodiments, the read voltage levels may be used to read each of the data pages of the first group 520. The programming unit 120 may select the BER of each of the data pages of the first group 520 as a criterion for selecting a verify voltage level mapped with the data of the first group 520.

Referring again to FIGS. 4 and 5 in the example provided in FIGS. 4 and 5, an MSB of the first group 520 flips from "0" to "1", or from "1" to "0" five times sequentially from the zeroth threshold voltage state 400 to the fifteenth threshold voltage state 415.

The control unit 130 may use a number of read voltage levels corresponding to a number of transitions from "0" to "1", and "1" to "0" while reading the MSB. The control unit 130 may use five read voltage levels to read the MSB in example embodiments of FIGS. 4 and 5. The first group 520 may correspond to the three-bit data, and thus the first group 520 may include three data pages. A number of read voltage levels which may be required by the control unit 130 to read the MSB, for example five, may be less than $2^3=8$.

In the example provided in FIGS. 4 and 5, four flips between "1" and "0" occur in a second row in FIG. 5, and thus the control unit 130 may require four read voltage levels when reading the second bit. In the example provided n FIGS. 4 and 5, six flips between "1" and "0" occur in a third row in FIG. 5, and thus the control unit 130 may require six read voltage levels when reading the third bit.

The control unit 130 may require five read voltage levels to read the MSB, four read voltage levels to read the second bit, and six read voltage levels to read the third bit. According to example embodiments, referring FIGS. 4 and 5, the memory device 100 may lower a BER of each of the data pages of the first group 520 in comparison to a BER in a conventional art, since eight is greater than five, four, or six.

Referring again to FIG. 1, the control unit 130 may divide the plurality of data pages into the first group and second group. The control unit 130 may read the data of the first group from the memory page 111 using a first read scheme, and may read the data of the second group from the memory page 111 using a second read scheme. The first read scheme may be a normal read scheme. The second read scheme may include reading the data of the second group after determining a plurality of read voltage levels based on the data of the first group.

Figure 6:
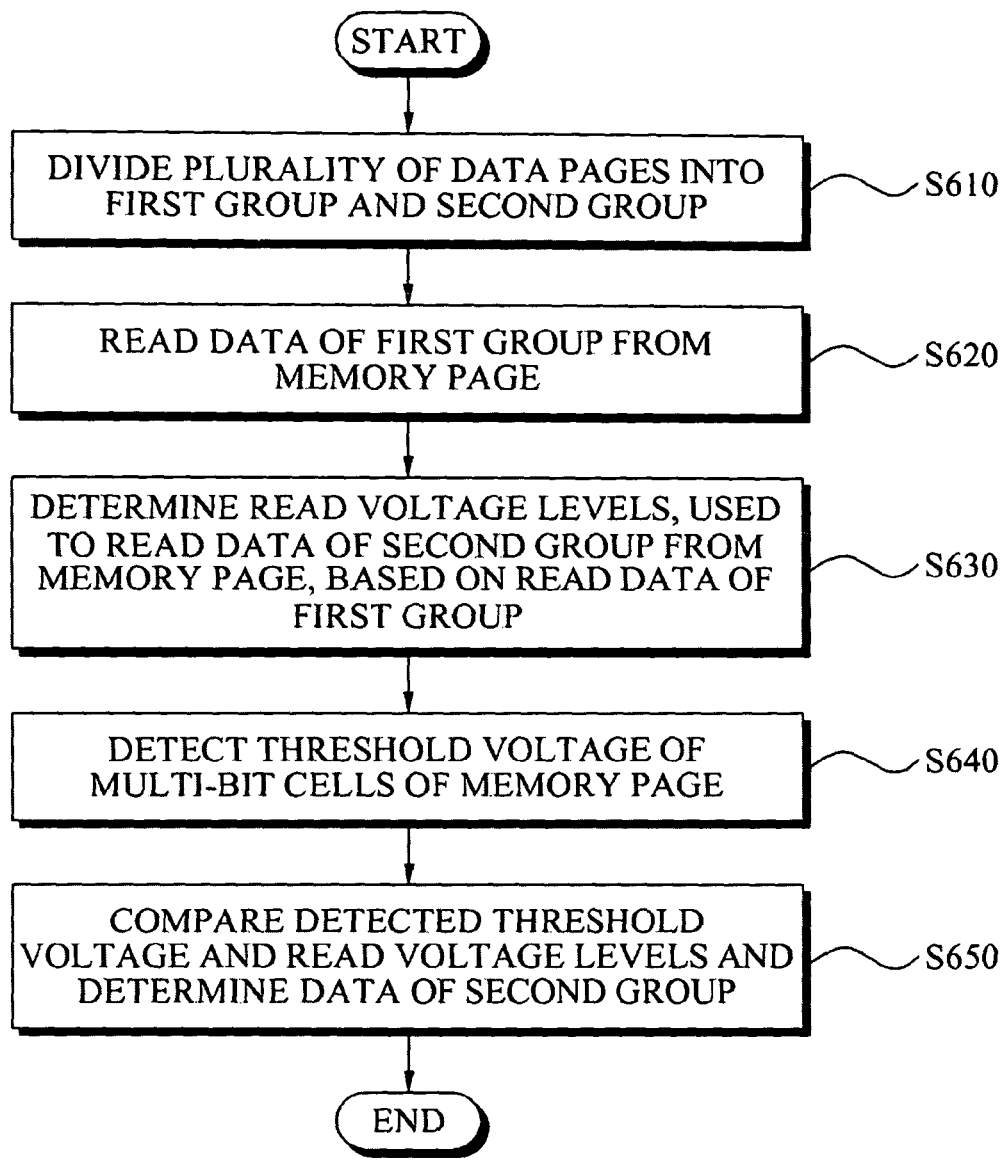
FIG. 6 is a flowchart illustrating a memory data reading method which reads a plurality of data pages from a memory page including multi-bit cells according to example embodiments.

FIG. 6 is a flowchart illustrating a memory data reading method which may include reading a plurality of data pages from a memory page including multi-bit cells according to example embodiments.

Referring to FIG. 6, in operation S610, the memory data reading method may divide the plurality of data pages into a first group and a second group.

In operation S620, the memory data reading method may include reading data of the first group from the memory page.

In operation S630, the memory data reading method may include determining read voltage levels based on the read data of the first group. The read voltage levels may be used to read data of the second group from the memory page.

In operation S630, the memory data reading method may include setting each of a plurality of result values of the read data of the first group as one symbol among a plurality of symbols, and divide the plurality of symbols into a plurality of symbol groups.

In operation S630, the memory data reading method may determine a single read voltage level with respect to each of the plurality of symbol groups. According to example embodiments, the read voltage level may be used to read the data of the second group.

In operation S640, the memory data reading method may include detecting a threshold voltage of the multi-bit cells of the memory page.

In operation S650, the memory data reading method may include comparing the detected threshold voltage and the read voltage levels and determining the data of the second group.

The memory data reading method according to example embodiments may be recorded in computer-readable media including program instructions to implement various operations embodied by a computer. The media may also include, alone or in combination with the program instructions, data files, data structures, and the like. The media and program instructions may be those specially designed and constructed for the purposes of example embodiments, or they may be of the kind well-known and available to those having skill in the computer software arts. Examples of computer-readable media may include magnetic media, for example hard disks, floppy disks, and magnetic tape; optical media, for example CD ROM disks and DVD; magneto-optical media, for example optical disks; and hardware devices that are specially configured to store and perform program instructions, for example read-only memory (ROM), random access memory (RAM), flash memory, and the like. Examples of program instructions may include both machine code, for example produced by a compiler, and files containing higher level code that may be executed by the computer using an interpreter. The described hardware devices may be configured to act as one or more software modules in order to perform the operations of example embodiments.

Flash memory devices and/or memory controllers according to example embodiments may be embodied using various types of packages. For example, the flash memory devices and/or memory controllers may be embodied using packages Package on Packages (PoPs), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Quad Flatpack (QFP), Small Outline Integrated Circuit (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The flash memory devices and/or the memory controllers may constitute memory cards. In this case, the memory controllers may be constructed to communicate with an external device for example, a host using any one of various types of protocols, for example a Universal Serial Bus (USB), a Multi Media Card (MMC), a Peripheral Component Interconnect-Express (PCI-E), Serial Advanced Technology Attachment (SATA), Parallel ATA (PATA), Small Computer System Interface (SCSI), Enhanced Small Device Interface (ESDI), and Integrated Drive Electronics (IDE).

The flash memory devices may be non-volatile memory devices that can maintain stored data even when power is cut off. According to an increase in the use of mobile devices, for example a cellular phone, a personal digital assistant (PDA), a digital camera, a portable game console, and an MP3 player, the flash memory devices may be more widely used as data storage and code storage. The flash memory devices may be used in home applications, for example a high definition television (HDTV), a digital video disk (DVD), a router, and a Global Positioning System (GPS).

A computing system according to example embodiments may include a microprocessor that is electrically connected with a bus, a user interface, a modem, for example a baseband chipset, a memory controller, and a flash memory device. The flash memory device may store N-bit data via the memory controller. The N-bit data may be processed or will be processed by the microprocessor and N may be 1 or an integer greater than 1. When the computing system is a mobile apparatus, a battery may be additionally provided to supply operation voltage of the computing system.

It will be apparent to those of ordinary skill in the art that the computing system according to example embodiments may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A memory device comprising:
a multi-bit cell array;
a programming unit that multi-bit programs a plurality of data pages in a memory page in the multi-bit cell array; and
a control unit that divides the plurality of data pages into a first group and a second group, reads data of the first group from the memory page using a first read scheme, and reads data of the second group from the memory page using a second read scheme,
wherein the first read scheme is different from the second read scheme, and
wherein the plurality of data pages includes N data pages, and the control unit determines the scheme of reading data of the second group from the memory page based on the read data of the first group.

2. The memory device of claim 1, wherein the control unit determines a read voltage level based on the read data of the first group, the read voltage level being used to read the data of the second group.

3. The memory device of claim 1, wherein the control unit estimates a change of a threshold voltage of multi-bit cells in the multi-bit cell array based on a Floating Gate (FG) coupling mechanism to determine the read voltage level used to read the data of the second group.

4. The memory device of claim 1, wherein the control unit estimates a change of a threshold voltage of multi-bit cells in the multi-bit cell array based on a charge loss mechanism to determine the read voltage level used to read the data of the second group.

5. The memory device of claim 1, wherein the control unit sets each of a plurality of result values of the read data of the first group as one symbol among a plurality of symbols, divides the plurality of symbols into a plurality of symbol groups, and assigns a single read voltage level with respect to each of the plurality of symbol groups, the read voltage level being used to read the data of the second group.

6. The memory device of claim 1, wherein N-bit data is stored in each multi-bit cell of the memory page, and the programming unit stores the N data pages using a maximum of 2N verify voltage levels in the memory page.

7. The memory device of claim 6, wherein the programming unit controls a Bit Error Rate (BER) of the data of the first group by adjusting a distance between the 2N verify voltage levels.

8. The memory device of claim 6, wherein, when the first group includes (N−1) data pages, the programming unit selects the 2N verify voltage levels to enable a number of read voltage levels to be less than 2(N−1), the read voltage level being used when the control unit reads each of the (N−1) data pages of the first group.

9. The memory device of claim 1, wherein the control unit Error Control Code (ECC)-decodes the read data of the first group, and determines a scheme of reading the data of the second group from the memory page based on the first ECC-decoded data of the first group.

10. The memory device of claim 9, wherein the control unit reads the data of the second group, and second ECC-decodes the read data of the second group, the second ECC-decoding being different from the first ECC-decoding.

11. A memory data reading method which reads a plurality of data pages from a memory page including multi-bit cells, comprising:

dividing the plurality of data pages into a first group and a second group;

reading data of the first group from the memory page;

determining read voltage levels based on the read data of the first group, the read voltage levels being used to read data of the second group from the memory page;

detecting a threshold voltage of the multi-bit cells of the memory page; and comparing the detected threshold voltage and the read voltage levels and determining the data of the second group.

12. The memory data reading method of claim 11, wherein the determining of the read voltage levels includes:

setting each of a plurality of result values of the read data of the first group as one symbol among a plurality of symbols, and dividing the plurality of symbols into a plurality of symbol groups; and determining a single read voltage level with respect to each of the plurality of symbol groups, the read voltage level being used to read the data of the second group.

13. A computer-readable recording medium storing a program for implementing a memory data reading method of reading a plurality of data pages from a memory page including multi-bit cells, comprising:

dividing the plurality of data pages into a first group and a second group;

reading data of the first group from the memory page;

determining read voltage levels based on the read data of the first group, the read voltage levels being used to read data of the second group from the memory page;

detecting a threshold voltage of the multi-bit cells of the memory page; and comparing the detected threshold voltage and the read voltage levels and determining the data of the second group.

* * * * *